(12) United States Patent
Lozhkin (10) Patent No.: US 9,263,999 B2
(45) Date of Patent: Feb. 16, 2016

(54) LINC POWER AMPLIFIER

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 66 days.

(21) Appl. No.: 13/927,845

(22) Filed: Jun. 26, 2013

(65) Prior Publication Data

US 2014/0049324 A1    Feb. 20, 2014

(30) Foreign Application Priority Data

Aug. 20, 2012    (JP) .................................. 2012-181841

(51) Int. Cl.
| | |
|---|---|
| H03F 3/68 | (2006.01) |
| H03F 3/21 | (2006.01) |
| H03F 1/02 | (2006.01) |
| H03F 1/56 | (2006.01) |
| H03F 3/60 | (2006.01) |

(52) U.S. Cl.
CPC ............... *H03F 3/211* (2013.01); *H03F 1/0294* (2013.01); *H03F 1/56* (2013.01); *H03F 3/602* (2013.01); *H03F 2200/423* (2013.01)

(58) Field of Classification Search
CPC ...................................................... H03F 3/211
USPC ............ 330/124 R, 295; 455/114.3; 375/296, 375/297
See application file for complete search history.

(56) References Cited

U.S. PATENT DOCUMENTS

| | | |
|---|---|---|
| 5,012,200 A | 4/1991 | Meinzer |
| 6,658,238 B1 | 12/2003 | Ursenbach et al. |
| 6,930,547 B2 | 8/2005 | Chandrasekaran et al. |
| 7,071,774 B2 | 7/2006 | Hellberg |
| 7,184,723 B2 | 2/2007 | Sorrells et al. |
| 8,755,454 B2 * | 6/2014 | Sorrells et al. ................ 375/295 |
| 2002/0047745 A1 | 4/2002 | Kolanek |
| 2006/0099919 A1 | 5/2006 | Sorrells et al. |
| 2008/0080639 A1 | 4/2008 | Ibrahim et al. |
| 2009/0163154 A1 | 6/2009 | Fonden et al. |

(Continued)

FOREIGN PATENT DOCUMENTS

| | | |
|---|---|---|
| JP | 2001-185967 A | 7/2001 |
| JP | 2002-520940 A | 7/2002 |

(Continued)

OTHER PUBLICATIONS

Iikka Hakala et al., "A 2.14-GHz Chireix Outphasing Transmitter", IEEE Transactions on Microwave Theory and Techniques, Jun. 2005, pp. 2129-2138, vol. 53, No. 6.

(Continued)

*Primary Examiner* — Khanh V Nguyen
*Assistant Examiner* — Khiem Nguyen
(74) *Attorney, Agent, or Firm* — Arent Fox LLP (57) ABSTRACT

A LINC power amplifier selects, based on an amplitude of an input signal, partial signals used for combination, and determines, based on the amplitude and a phase of the input signal, an amplitude and a phase of the selected partial signals so that a range of output power that the LINC power amplifier operates a given efficiency is expanded, inputs the selected partial signals to corresponding power amplifiers, and combines signals obtained by amplification of the selected partial signals by the corresponding power amplifiers.

9 Claims, 7 Drawing Sheets

(56) References Cited

U.S. PATENT DOCUMENTS

| | | | |
|---|---|---|---|
| 2010/0074367 A1 | 3/2010 | Kim et al. | |
| 2010/0117727 A1 | 5/2010 | Dawson et al. | |
| 2010/0244949 A1 | 9/2010 | Gustavsson et al. | |

FOREIGN PATENT DOCUMENTS

| | | | |
|---|---|---|---|
| JP | 2008-086006 A | 4/2008 | |
| JP | 2008-518514 A | 5/2008 | |
| JP | 2008-135829 A | 6/2008 | |
| JP | 2009-213090 A | 9/2009 | |
| JP | 2009-533947 A | 9/2009 | |
| JP | 2009-284174 A | 12/2009 | |

OTHER PUBLICATIONS

Lawrence F. Cygan, "A High Efficiency Linear Power Amplifier for Portable Communications Applications", CSIC 2005 Digest, Wireless Technology Research Laboratory Motorola Labs, pp. 153-157
Xuejun Zhang et al., "Gain/Phase Imbalance-Minimization Techniques for LINC Transmitters", IEEE Transaction on Microwave Theory and Techniques, Dec. 2001, pp. 2507-2516, vol. 49, No. 12.
Partial Japanese Office Action issued on Sep. 29, 2015; Japanese Application No. 2012-181841.

* cited by examiner

LINC POWER AMPLIFIER

CROSS-REFERENCE TO RELATED APPLICATION

This application is based upon and claims the benefit of priority of the prior Japanese Patent Application No. 2012-181841, filed on Aug. 20, 2012, the entire contents of which are incorporated herein by reference.

FIELD

Disclosure is related to a LINC (Linear Amplification with Nonlinear Components) power amplifier.

BACKGROUND

Communication standards applied to communication systems in recent years include, for example, Division Multiple Access (W-CDMA), Long Term Evolution (LTE), Worldwide Interoperability for Microwave Access (WiMAX: IEEE802.16-2004, IEEE802.16e, etc.). Further, the communication standards may include Orthogonal Frequency Division Multiplexing Access (OFDMA).

The above-mentioned wireless communication systems require linear efficient RF power amplifiers for wideband signals like that can provide higher data transmission rates. Conventional power amplifiers (PAs) are normally designed for peak efficiency under maximum (peak) output power condition. Consequently, when the power is backed-off from its maximum point, efficiency of the power amplifier drops sharply. As a result, the mean amplifier efficiency is much lower than the efficiency at peak power level.

There are composite type power amplifiers including a plurality of power amplifiers (usually only two, rare three or more). The composite power amplifiers include Doherty amplifiers and LINC or outphasing power amplifiers. Such multi-way amplification schemes are able to provide a high efficiency in power back-off operation through active load modulation in their active devices.

The LINC power amplifier (outphasing power amplifier) is one of the promising techniques that can simultaneously achieve high linearity and high power efficiency. The LINC amplifier takes an envelope modulated bandpass waveform and resolves it into two phased modulated (PM) constant envelope signals, which are applied to highly efficient and highly nonlinear power amplifiers, whose outputs are summed (combined).

Figure 1:
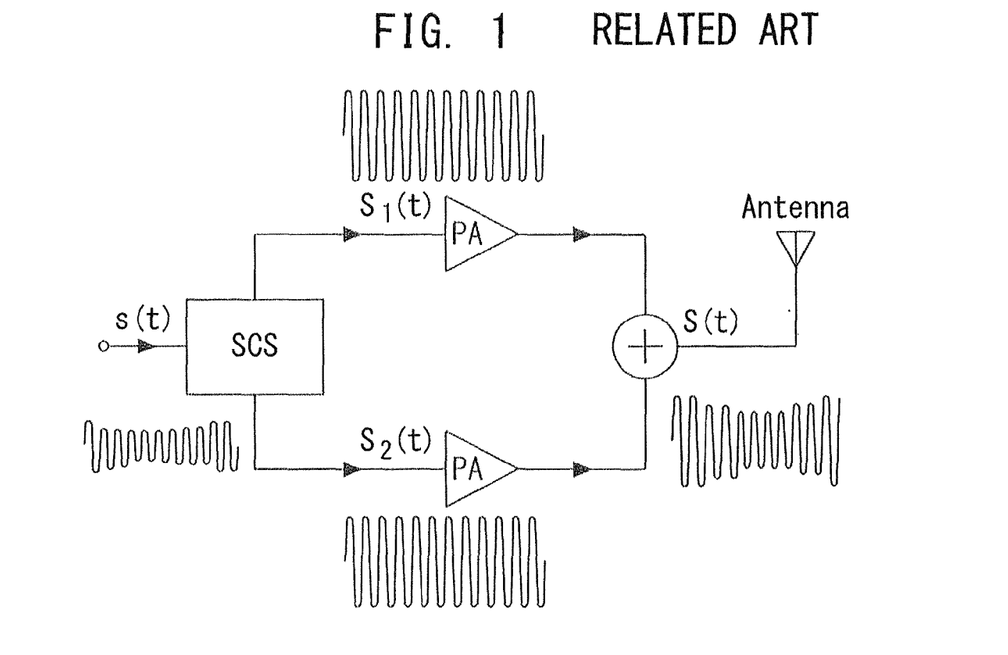
FIG. 1 is a diagram illustrating a simplified block diagram of a LINC power amplifier.
Figure 2:
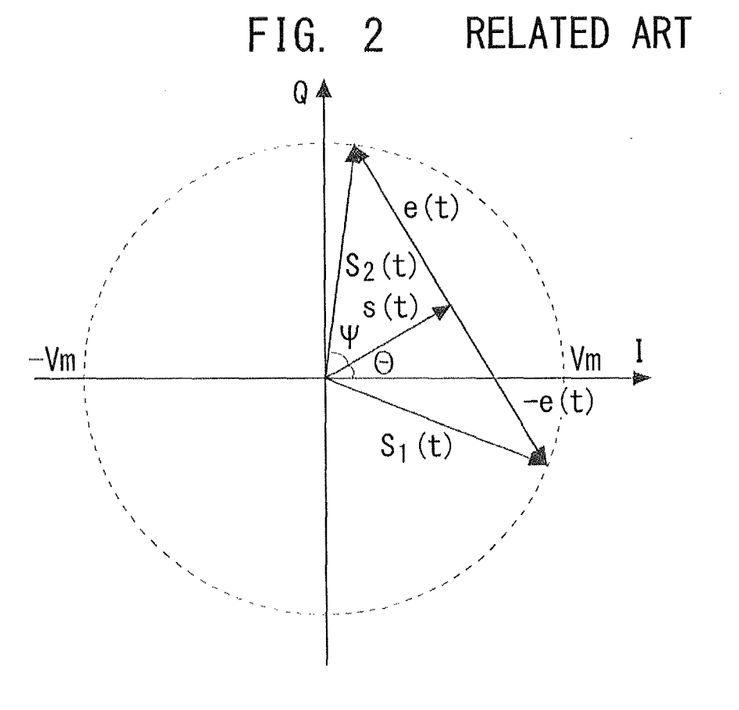
FIG. 2 is a vector diagram representing constant envelope signals $S_1(t)$ and $S_2(t)$ and an outphasing signal $e(t)$.

FIG. 1 is a diagram illustrating a simplified block diagram of a LINC power amplifier and FIG. 2 is a vector diagram representing constant envelope signals $S_1(t)$ and $S_2(t)$ and an outphasing signal e(t). Separation of bandpass waveform (band-limited source RF signal: bandpass signal) is executed by a signal component separator (SCS). A complex representation of the bandpass signal (referred to as input signal) may be written by a formula (1).

[Formula (1)]

$$s(t) = a(t) \cdot e^{\Theta(t)}; \quad 0 < a(t) < V_m \tag{1}$$

Where a(t) is the real envelope and Θ(t) represents the original phase modulation in the input AM signal. $V_m$ is the maximum amplitude of the signal s(t).

The input signal is separated by the SCS into two constant-envelopes PM signals $S_1(t)$ and $S_2(t)$ having equal envelopes and opposite modulated phase variations. These two RF signals $S_1(t)$ and $S_2(t)$ with modulated phase and constant amplitudes can be represented as vector as illustrated in FIG. 2. The signals $S_1(t)$ and $S_2(t)$ and a phase angle ψ is represented by formulas (2), (3) and (4) below. Where e(t) is a quadrature or outphasing signal and defined by formula (5).

$$S_1(t) = s(t) - e(t) \tag{1}$$

$$S_2(t) = s(t) + e(t) \tag{2}$$

$$\psi(t) = \cos^{-1}\left(\frac{|a(t)|}{V_m}\right) \tag{3}$$

$$e(t) = j \cdot s(t) \cdot \sqrt{\frac{V_m^2}{a^2(t)} - 1} \tag{4}$$

The signal $S_1(t)$ and $S_2(t)$ is amplified by two power amplifiers connected to the SCS individually, and the amplified signal of The signal $S_1(t)$ and $S_2(t)$ is sent to the power combiner. With the power combining, the in-phase signal components add together and the out-of-phase signal components cancel out. The resultant signal is the desired amplified replica of the original source signal (see formula (6)).

$$s(t) = 0.5(S_1(t) + S_2(t)); \tag{6}$$

For more information, see U.S. Pat. No. 5,012,220, Japanese Unexamined Patent Application Publication (Translation of PCT Application) No. 2009-533947, Japanese Unexamined Patent Application Publication (Translation of PCT Application) No. 2008-518514, Japanese Unexamined Patent Application Publication (Translation of PCT Application) No. 2009-213090, U.S. Patent Application Publication No. 2010/0244949, U.S. Pat. No. 7,184,723, U.S. Patent Application Publication No. 2010/0074367, "X. Zhang et al., "Gain/Phase Imbalance-Minimization Techniques for LINC Transmitters", IEEE Trans On Microwave Theory And Techniques, Vol. 49, No. 12, December 2001", "I. Hakala, "A 2.14-GHz Chireix Outphasing Transmitter", IEEE Trans On Microwave Theory And Techniques, Vol. 53, No. 6 June 2005", and "Lawrence F. A., "High Efficiency Linear Power Amplifier for Portable Communications Applications," CSIC 2005 Digest Wireless Technology Research Laboratory Motorola Labs."

However, one of the major disadvantages of the LINC power amplifier is that the possible loss in the power combining network compromises the power efficiency. For example, when a conventional_hybrid is used as the combiner, power of the outphasing signal e(t) turns into waste heat. An alternative combining approach, called Chireix, expands an area having high efficiency to a low power output level by shunt susceptance compensation (compensation reactance). Chireix may change an efficiency curve so as to adapt to different peak to average power ratio by variation of the compensation susceptance (compensation reactance).

Figure 3:
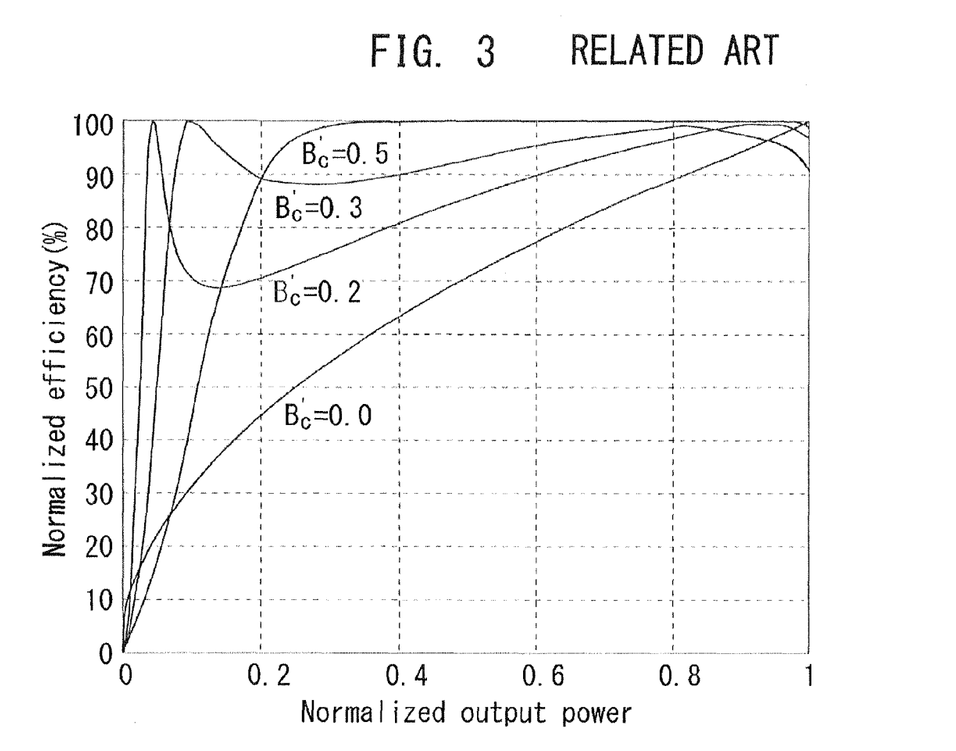
FIG. 3 illustrates the power efficiency versus the output power with and without shunt susceptance compensation.

FIG. 3 illustrates the power efficiency versus the output power with and without shunt susceptance compensation. The output power is normalized to the maximum value, as has the efficiency. As depicted in FIG. 3, the appropriate selection of the compensation susceptance can result in a significant boost in system efficiency, especially at the lower output power level. With small susceptance, good compensation is obtained at low output power level, but the efficiency at higher power levels is lower than that without compensation, for now the compensation susceptances become excessive.

SUMMARY

An embodiment of the invention is a LINC power amplifier including:

at least three power amplifiers;

a first circuit to select, based on an amplitude of an input signal, at least two partial signals used for combination among at least three partial signals to be inputted to the at least three power amplifiers, and to determine, based on the amplitude and a phase of the input signal, an amplitude and a phase of the at least two partial signals so that an area which a given efficiency of the LINC power amplifier is obtained is expanded;

a second circuit to input the at least two partial signals each having the amplitude and the phase that are determined to corresponding power amplifiers among the at least three power amplifiers; and a combiner to combine signals obtained by amplification of the at least two partial signals at the corresponding power amplifiers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An embodiment will hereinafter be described with reference to the drawings. A configuration in the embodiment is an exemplification, and the claimed invention is not limited to the configuration in the embodiment.

The embodiment adjusts the angle $\psi$ in order to minimize outphase component as represented in FIG. 2 instead of adjusting the compensation reactance (see FIG. 3) for the individual HPA. As can be seen from FIG. 2, the angle $\psi$ defines the level of the useless outphasing signal $e(t)$.

In the embodiment, the angle $\psi$ is adjusted to minimize an amplitude of the useless outphasing signal $e(t)$. By the adjusting of the angle, the outphasing component $e(t)$ is reduced. The reduction of the outphasing component attracts reduction of loss in the LINC system. Therefore, total efficiency of the LINC power amplifier increases.

The patent document 1 (U.S. Pat. No. 5,012,200) as a reference example discloses a 3-way Doherty amplifier that an additional signal $S_3(t)$ is introduced in order to reduce a level of the outphasing signal $e(t)$ and to reduce the total LINC loss. An input signal of the Doherty amplifier may be expressed by a formula (7) as follows.

$$s(t)=S_1(t)+S_2(t)+S_3(t); \quad (7)$$

Figure 4:
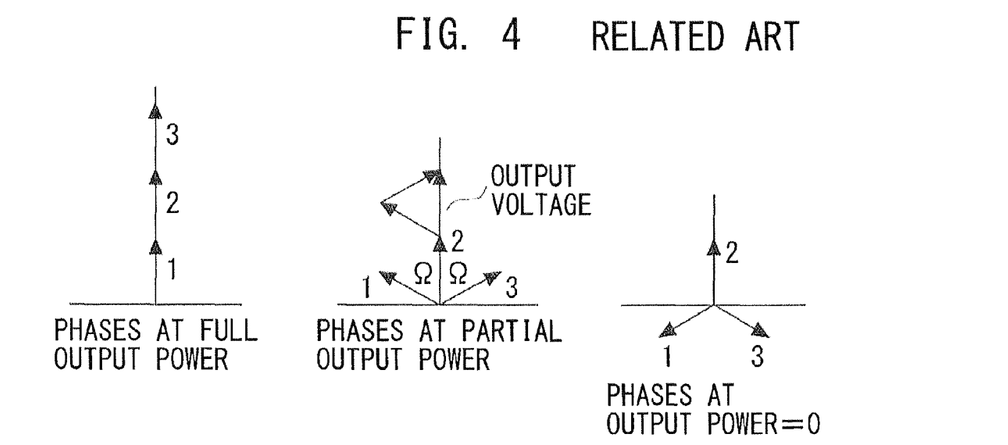
FIG. 4 is vector diagrams in the patent document 1 as reference.

Thus, according to the patent document 1, the totally three signals with equal amplitudes are involved into the original signal s(t). In the patent document 1, reactive loads of each of the power amplifiers are compensated by the shunt susceptances connected to each of the power amplifiers to increase the power efficiency. That is, as illustrated in FIG. 4 (reference diagram), when in-phase outputs 1, 2 and 3 of three power amplifiers are combined, the maximum output power is obtained. As illustrated in FIG. 4, when the vector of the outputs 1, 2 and 3 has different direction, their resultant vector becomes an output voltage. Further, when an angle between the vectors of the output 1, 2 and 3 is 120 degree, the output power becomes zero.

The technology in the patent document 1 performs selection of optimized phase angle between signals $S_1(t)$, $S_2(t)$ and $S_3(t)$ despite increasing the efficiency. Hence, the problem with high level outphasing signal for the input signal s(t) with small amplitude remains. That is, when input signal s(t) has zero amplitude (output power is zero), all three signals $S_1(t)$, $S_2(t)$ and $S_3(t)$ are combined with $\Psi=120°$ in order to provide zero output signal as illustrated in FIG. 4. Then the whole power from signals $S(t)$, $S_2(t)$ and $S_3(t)$ is transferred to the outphasing power i.e. losses.

Figure 5:
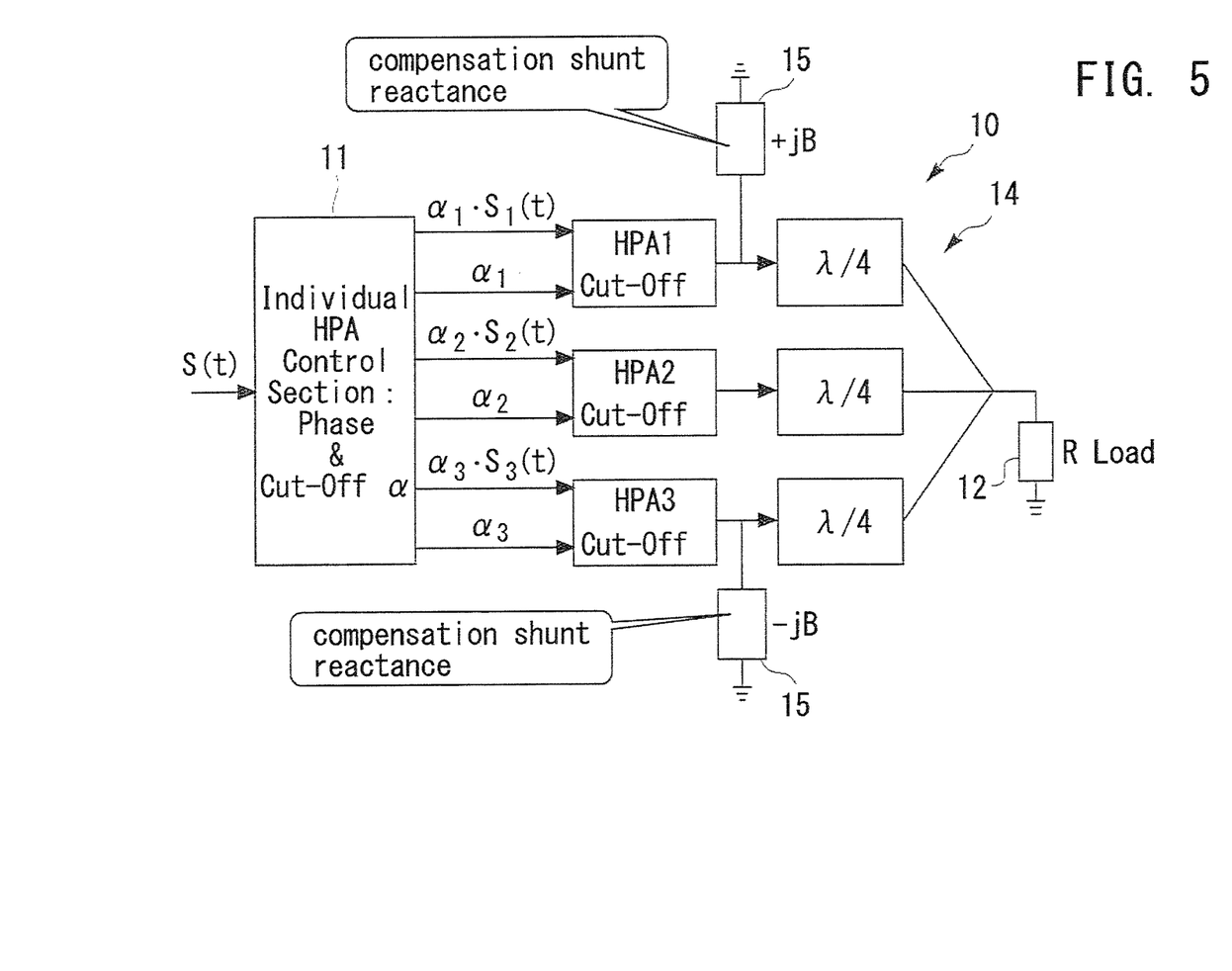
FIG. 5 illustrates a configuration example of a LINC power amplifier relating to the embodiment of the invention.

FIG. 5 illustrates a configuration example of a LINC power amplifier relating to the embodiment of the invention. The LINC power amplifier 10 in FIG. 5 has three way (i.e. three HPA branches). However, three or more (at least three) may be selected as the number of ways (branches).

In FIG. 5, the LINC power amplifier 10 includes a control network 11, a common load 12, three high power amplifiers (HPAs) 1-3 disposed between the control network 11 and the common load 12. Each of the HPAs 1-3 is an example of a power amplifier. The common load 12 provides a given output impedance to each of the HPAs 1-3.

Output signals of the HPAs 1-3 are combined by Chireix system 14. The Chireix system 14 is an example of a combiner; Output ports of the HPAs 1-3 are connected to individual $\lambda/4$ lines. The $\lambda/4$ lines is connected at a given combination point connected to the common load. Further, the output port of each of the HPAs 1-3 is connected to compensation susceptance (compensation reactance) 15. However, the compensation reactance 15 corresponding to the output of the HPA 2 is unillustrated (representation is omitted).

The control network 11 receives a signal s(t) being as a target of amplification of the LINC power amplifier 10. The control network 11 generates, from the input signal s(t), signals $S_1(t)$, $S_2(t)$ and $S_3(t)$ each of which is a partial signal (or separated signal) to be inputted to a corresponding HPA among the HPAs 1-3.

The signal $S_1(t)$ to be inputted to the HPA 1, the signal $S_2(t)$ to be inputted to the HPA 2, and the signal $S_3(t)$ to be inputted to the HPA 3 each has zero or a constant non-zero amplitude $A_k$. Such binary amplitude selection is achieved by multiplication the original signals $S_k(t)$ with a weigh coefficient (cutoff parameter) $\alpha_k$. Where $\alpha_k$ is one or zero, and k is positive integers (k=1, 2, ..., N, N is an arbitrary positive integer) equal to the number of ways (HPAs). In this embodiment, k is one, two or three. Processing or operation to obtain zero-input to each of the HPAs 1-3 is achieved by:

(a) Setting HPA input to zero;
(b) Grounding HPA input;
(c) Setting cut-off bias; or
(d) Switching off HPA power supplier.

The HPA 1 to HPA 3 are designed to present high impedance to the combining node (common load 12) when its output signal is zero or in the cut-off mode. All other HPA for the fixed input signal amplitudes have high efficiency.

The input signal s(t) inputted to the LINC power amplifier 10 is expressed by a formula (8) below.

$$s(t)=\alpha_1 \cdot S_1(t)+\alpha_2 \cdot S_2(t)+\alpha_3 \cdot S_3(t); \quad (8)$$

As described above, cut-off parameters $\alpha_k$ have the two possible values $\alpha_k=\{1 \text{ or } 0\}$, k=1, 2, 3. The zero for $\alpha_k$ is achieved by assigning zero at the k-th HPA input amplitude or setting k-th HPA in the cut-off mode by applying bias voltage.

In order to obtain the total HPA efficiency highest as possible, the amplitudes of the signals $S_1(t)$, $S_2(t)$ and $S_3(t)$ in the embodiment might be not equal (unbalances). In contrast, the technology disclosed in the patent documents 1 requires that all signals amplitude must be the same.

Assuming that the maximum amplitude of the HPA input signal s(t) amplitude is $V_m=S_1(t)+S_2(t)+S_3(t)$ and the minimum input signal amplitude is 0 (zero). Thus, one of possible selection for the individual signal is $S_1(t)=S_2(t)+S_3(t)$; $S_2(t)=S_3(t)$; $S_1(t)=2 \cdot S_2(t)$.

In order to maximize HPA efficiency, processing (A) or (B) is executed.

(A) keep the minimum number of the partial signals $S_1(t)$ $S_2(t)$ and $S_3(t)$ that uses for s(t) reproduction.

(B) keep the minimum angles $\Psi_k$ between partial signals $S_1(t)$ $S_2(t)$ and $S_3(t)$ that have been selected for s(t) reproduction.

The signals $S_1(t)$, $S_2(t)$ and $S_3(t)$ have fixed amplitudes $A_1$, $A_2$ and $A_3$ and phase angle $\psi_1$, $\psi_2$ and $\psi_3$. The selectable cut-off parameters $\alpha_k$ are $\alpha_1$, $\alpha_2$ and $\alpha_3$. Thus, the possible individual signals $S_1(t)$, $S_2(t)$ and $S_3(t)$ to construct HPA input signal s(t) are expressed by formulas (9).

$$S_1(t)=\alpha_1 \cdot A_1 \cdot e^{\Psi_1(t)}; S_2(t)=\alpha_2 \cdot A_2 \cdot e^{\Psi_2(t)}; \text{ and}$$
$$S_3(t)=\alpha_3 \cdot A_3 \cdot e^{\Psi_3(t)}; \quad (9)$$

When phases of the three signals $S_1(t)$, $S_2(t)$ and $S_3(t)$ are zero ($\psi_1=\psi_2=\psi_3=0$), all amplitudes $A_1$, $A_2$ and $A_3$ of the signals $S_1(t)$, $S_2(t)$ and $S_3(t)$ are selected in order to get the maximum HPA input voltage $V_m$. Then a value "1" is selected for all cut-off parameters $\alpha_1$, $\alpha_2$ and $\alpha_3$ ($\alpha_1=\alpha_2=\alpha_3=1$) and all three signals are summed in-phase to calculated the voltage $V_m$ ($A_1+A_2+A_3=V_m$).

One possible solution is selection amplitudes $A_1$, $A_2$ and $A_3$ satisfying $A_1=A_2+A_3$ and $A_2+A_3=A_1/2$. Note that, the outphasing HPA as illustrated in FIG. 1 has a single option to select phase of signals $S_1(t)$ and $S_2(t)$ expressed by formulas (10) and (11).

$$S_1(t)=A \cdot e^{+\Psi(t)} \quad (10)$$

$$S_2(t)=A \cdot e^{-\Psi(t)} \quad (11)$$

However, in the embodiment, there are multiple options to construct the required signal s(t). Multiple options provide better trade-off between signal parameters selection (formula (9)), compensation shunt reactance and HPA efficiency. Thus, even if the amplitudes for all signals $S_1(t)$, $S_2(t)$ and $S_3(t)$ are fixed, there is still the multiple choice for the rest of signals parameters such as cut-off coefficient $\alpha_k$ and the phase $\psi_k$ (k=1, 2, 3).

The control network 11 selects the cut-off parameter $\alpha_k$ and the phase $\psi_k$ in order to obtain the maximum HPA efficiency. Here, it is assumed that amplitudes of the signals $S_1(t)$, $S_2(t)$ and $S_3(t)$ satisfy $A_2+A_3=A_1/2$. The selecting method of signal parameters $\alpha_k$ and $\psi_k$ under the assumption are as follows.

<Case 1> in a Case where an Amplitude Value |s(t)| of the Signal s(t) Satisfies $A_1+A_2<|s(t)|<V_m$ As mentioned above, the sum of amplitudes $A_1$, $A_2$, and $A_3$ is the maximum HPA input voltage $V_m$ ($A_1+A_2+A_3=V_m$). The signals $S_1(t)$, $S_2(t)$ and $S_3(t)$ and the phase $\psi_2(t)$ in the case 1 are expressed by formulas (12) and (13) below.

$$S_1(t)=A_1 \cdot e^{i\Theta(t)}, S_2(t)=A_2 \cdot e^{i\psi_2(t)} \text{ And } S_3(t)=A_3 \cdot e^{-i\psi_3(t)} \quad (12)$$

$$\Psi_2(t)=\Psi_3=\arccos((|s(t)|-A_1)/2A_2) \quad (13)$$

Figure 6:
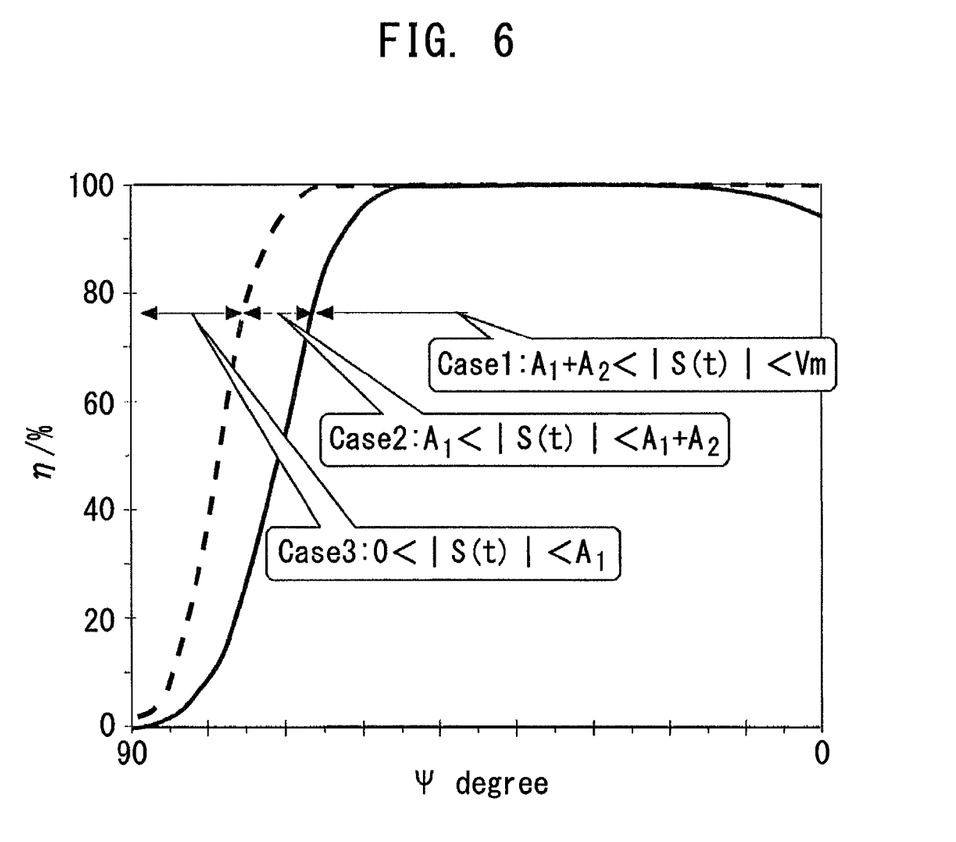
FIG. 6 is a diagram indicating a relationship between the phase angle $\Psi$ and the efficiency $\eta(\%)$ of the amplifier.

The cut-off parameters $\alpha_1$, $\alpha_2$, $\alpha_3$ in the case 1 are one. FIG. 6 is a diagram indicating a relationship between the phase angle $\Psi$ and the efficiency $\eta(\%)$ of the amplifier. With the appropriate shunt susceptance compensation such signal parameters selection provides high HPA efficiency for phase's $\psi$ less 60 degree (see FIG. 6).

<Case 2> in a Case where an Amplitude Value |s(t)| of the Signal s(t) Satisfies $A_1<|s(t)|<A_1+A_2$ A range of the case 2 indicates an area of middle amplitudes of the signal s(t). Thus it is reasonable to use only signals $S_1(t)$ and $S_2(t)$ (signals with high amplitude $A_1$ and signal with the low amplitude $A_2$ ($A_2=A_1/2$) and put signal $S_3(t)$ in the cut-off mode by selection cut-off parameter $\alpha_3=0$. The signals $S_1(t)$ and $S_2(t)$ and the phase $\psi_2(t)$ in the case 2 are expressed by formulas (14) and (15) below.

$$S_1(t)=A_1 \cdot e^{i\Theta(t)}, S_2(t)=A_2 \cdot e^{-i\psi_2(t)} \quad (14)$$

$$\Psi_2(t)=\arccos((|s(t)|-A_1)/A_2) \quad (15)$$

<Case 3> in a Case where an Amplitude Value |s(t)| of the Signal s(t) Satisfies $0<|s(t)|<A_1$ In order to minimize the outphasing power, in the area of small amplitudes s(t) with an amplitude smaller than the amplitude $A_1$, it is reasonable to use only signals $S_2(t)$ and $S_3(t)$ (i.e. signals with the small amplitudes $A_2=A_3=A_1/2$) and put signal $S_1(t)$ in the cut-off mode by selection cut-off parameter $\alpha_1=0$. The signals $S_2(t)$ and $S_3(t)$ and the phase $\psi_2(t)$ in the case 3 are expressed by formulas (16) and (17) below.

$$S_2(t)=A_1 \cdot e^{i\psi_2(t)}, S_3(t)=A_2 \cdot e^{-i\psi_2(t)} \quad (16)$$

$$\Psi_2(t)=\arccos(s(t)/A_1) \quad (17)$$

Figure 7:
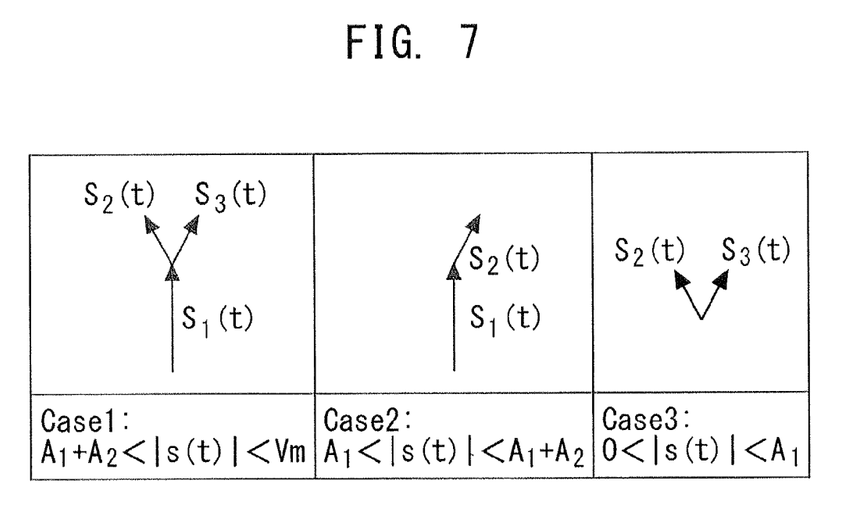
FIG. 7 illustrates vector diagrams in the cases 1 to 3.

FIG. 7 illustrates vector diagrams corresponding to the cases 1 to 3. Note that in all cases 1 and 2 and partially case 3, the phase $\psi$ is keeping the relatively low values that correspond to the higher HPA efficiency from FIG. 6. For the case of the small amplitude (case 3), the number of the signals is reduces to two and system operates like the LINC illustrated in FIG. 1. However because of the selection signals with the small amplitudes $A_2$ and $A_3$ (which amplitude is the half of the signal amplitude for LINC in FIG. 1) the efficiency of LINC is increased.

Figure 8:
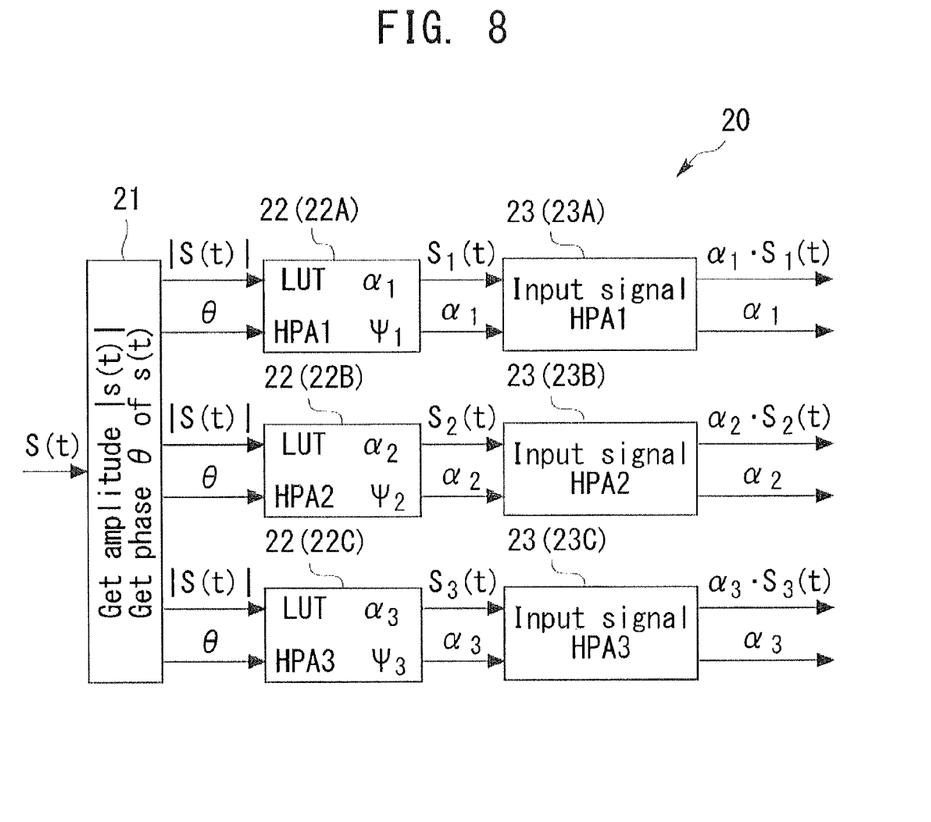
FIG. 8 illustrates an example of a controller for the HPAs.

FIG. 8 illustrates an example of a controller for the HPAs 1-3. The controller 20 is included in the control network 11 in FIG. 5. The controller 20 includes an amplitude phase detecting circuit (detector) 21, parameter determining circuits (determiner) 22 (22A, 22B and 22C) corresponding to the HPAs 1-3, and input signal generating circuits (generator) (23A, 23B and 23C) corresponding to the HPAs 1-3.

The amplitude phase detecting circuit 21 detects an amplitude |s(t)| and a phase $\Theta$ of the input signal s(t). The parameter determining circuits 22A, 22B and 22C include a look-up table (LUT) storing the cut-off parameter $\alpha_k$, and the phase $\psi_k$ corresponding to the amplitude |s(t)| and the phase $\Theta$.

Each of the LUTs included in the parameter determining circuits 22A, 22B and 22C is made on a storage device (e.g. memory), and memories values of $\alpha_k$ and $\psi_k$ corresponding to the cases 1-3 (see formulas (12) to (17)). For example, the amplitude |s(t)| is used as an address selector to the LUT. The LUT stores a plurality of records to memory the values of $\alpha_k$ and $\psi_k$ corresponding to the amplitude |s(t)|. Corresponding record (the values of $\alpha_k$ and $\psi_k$) is read from the LUT according to the inputted amplitude value |s(t)|.

The parameter determining circuits 22A, 22B, 22C are synchronized with each other, and determines at least, the cut-off parameters $\alpha_1, \alpha_2, \alpha_3$ and $\psi_1, \psi_2, \psi_3$ according to the amplitude value |s(t)|. However, the parameter determining circuit 22A corresponding to the HPA 1 determines the phase of the input signal s(t) as the $\psi_1$.

The parameter determining circuit 22A generates the signal $S_1(t)$ being a constant envelope signal having the determined cut-off parameter $\alpha_1$ and a given or predetermined amplitude $A_1$, and outputs the signal $S_1(t)$ and the determined parameter $\alpha_1$. The parameter determining circuit 22B generates the signal $S_2(t)$ being a constant envelope signal having the determined cut-off parameter $\alpha_2$ and a given or predetermined amplitude $A_2$, and outputs the signal $S_2(t)$ and the determined parameter $\alpha_2$. The parameter determining circuit 22C generates the signal $S_3(t)$ being a constant envelope signal having the determined cut-off parameter $\alpha_3$ and a given or predetermined amplitude $A_3$, and outputs the signal $S_3(t)$ and the determined parameter $\alpha_3$. The parameter determining circuits 22A, 22B, 22C is an example of a first circuit.

The signal generating circuits 23A, 23B and 23C receives the signal $S_k(t)$ ($S_1(t)$, $S_2(t)$ or $S_3(t)$) and the parameter $\alpha_k$ ($\alpha_1$, $\alpha_2$ or $\alpha_3$) from the corresponding parameter determining circuit 22A, 22B or 22C.

The input signal generating circuit 23A generates the HPA input signal $\alpha_1 \cdot S_1(t)$ by multiplying the parameter $\alpha_1$ by the signal $S_1(t)$ and sends the HPA input signal $\alpha_1 \cdot S_1(t)$ and the parameter $\alpha_1$ to the HPA 1. The input signal generating circuit 23B generates the HPA input signal $\alpha_2 \cdot S_2(t)$ by multiplying the parameter $\alpha_2$ by the signal $S_2(t)$ and sends the HPA input signal $\alpha_2 \cdot S_2(t)$ and the parameter $\alpha_2$ to the HPA 2. The input signal generating circuit 23C generates the HPA input signal $\alpha_3 \cdot S_3(t)$ by multiplying the parameter $\alpha_3$ by the signal $S_3(t)$ and sends the HPA input signal $\alpha_3 \cdot S_3(t)$ and the parameter $\alpha_3$ to the HPA 1. However, when the cut-off parameter $\alpha_k$ (k=1, 2, 3) is zero (0), the HPA input signal becomes zero. The input signal generating circuits 23A, 23B, 23C is an example of a second circuit.

Each of the HPAs 1-3 performs amplification operation to the input signal $\alpha_k \cdot S_k(t)$ (=$S_k(t)$) when the parameter $\alpha_k$ is one (1).

Another possible alternative for the appropriate signal parameters ($\psi_1, \psi_2, \psi_3, \alpha_1, \alpha_2, \alpha_3$) selections is construction of LUT for HPA input signal magnitude that contains the signals phases $\psi$ and cut-off coefficients $\alpha$ for each amplifier that provides the maximum HPA efficiency (not calculated by formula, but extracted, for example, from the experimental data). In both cases appropriate selection for parameters $\psi_1, \psi_2, \psi_3, \alpha_1, \alpha_2, \alpha_3$ corresponds to the maximum HPA efficiency. Note that the maximum HPA efficiency is an example a given or predetermined efficiency.

In the embodiment, by inputting the cut-off parameter $\alpha$ to each of the HPAs 1-3, any one of the processings (b) to (d) for obtaining the HPA input signal being zero. In contrast, when the processing (a) is executed, inputting the cut-off parameter $\alpha$ to each of the HPAs 1-3 is not essential feature.

The control network 11 illustrated in FIG. 5 and blocks of the controller 20 illustrated in FIG. 8 are realized by using a Large Scale Integrated circuit (LSI) (including Integrated Circuit (IC), Application Specific Integrated Circuit (ASIC) etc.). Function of each of the blocks may be realized by at least one LSI. A single LSI may realize a plurality of functions of the blocks. Further, if possible, function of each of the blocks may be realized by a processor (e.g. microprocessor such as Central Processing Unit (CPU), Digital Signal Processor (DSP)), executing program (instructions) stored in a storage device. Moreover, programmable logic devices (PLD), such as Field-Programmable Gate Array (FPGA), may be applied to realize function of each of the blocks. Note that the HPAs 1-3 may be realized by using a power transistor.

Figure 9:
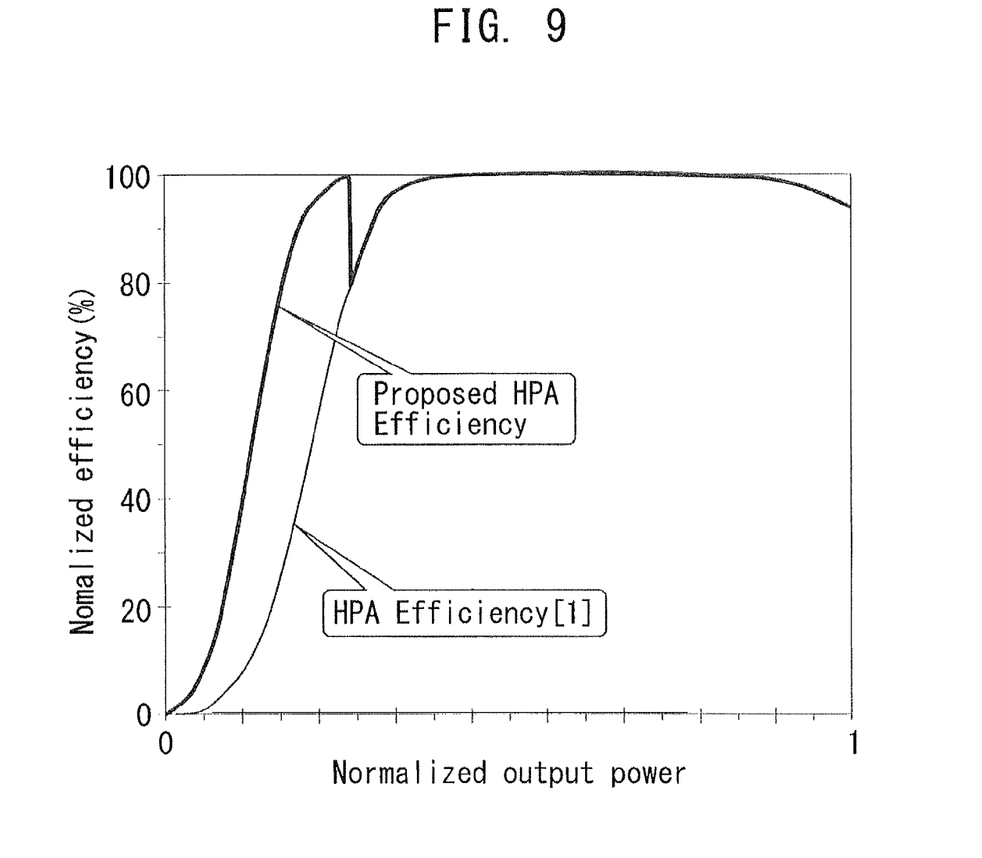
FIG. 9 represents the simulated efficiency for the 3-way (N=3) LINC (outphasing) amplifier in the embodiment.

FIG. 9 represents the simulated efficiency for the 3-way (N=3) LINC (outphasing) amplifier in the embodiment. As can be seen from FIG. 9, because of the optimized selection for parameters $\psi_1, \psi_2, \psi_3, \alpha_1, \alpha_2, \alpha_3$ the range for normalized output power where HPA operates with the high efficiency is extended into the area of the small input signal s(t) amplitudes. Therefore, the average efficiency of the N-way amplifier will also increase.

According to the embodiment of the invention is able to expand a range of output power that the power amplifier operates at high efficiency. In other words, according to the embodiment, it is possible that multiple representation of the LINC HPA output signal by adjusting weight and angle parameters $\alpha$ and $\psi$ for signals of the individual HPAs.

The selection of the cut-off parameter $\alpha$, which is binary weight (0 or 1), is performed so as to minimize the number of signals in use and/or to maximize the HPA efficiency. The selection of the cut-off parameter $\alpha$ may be performed so as to minimize the error vector magnitude (EVM) for signals in the common load 12 and/or phase angle $\psi$ between signals. According to the embodiment, by the selection of the signal parameters $\alpha$ and $\psi$, a range of output power that the LINC power amplifier operates at high efficiency is expanded to a small amplitude area of the output power.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A LINC power amplifier, comprising:
    at least three power amplifiers;
    a first circuit to select, based on an amplitude of an input signal, at least two partial signals used for combination among the at least three partial signals to be inputted to the at least three power amplifiers, and to determine, based on the amplitude and a phase of the input signal, an amplitude and a phase of each of the at least two partial signals so that an efficiency of the LINC power amplifier is increased;
    a second circuit configured to receive the at least two partial signals each having the amplitude and the phase that are determined to correspond to the power amplifiers among the at least three power; and
    a combiner to combine signals obtained by amplification of the at least two partial signals at the corresponding power amplifiers.

2. The LINC power amplifier according to claim 1, wherein an input of a power amplifier corresponding to a partial signal not selected by the first circuit becomes zero.

3. The LINC power amplifier according to claim 1, wherein the at least three power amplifiers include a first power amplifier, a second power amplifier and a third power amplifier;

the first circuit generates a first partial signal to be inputted to the first power amplifier, a second partial signal to be inputted to the second power amplifier and having a half amplitude of an amplitude of the first partial signal, and a third partial signal to be inputted to the third power amplifier and having an amplitude equal to the amplitude of the second power amplifier; and the first circuit selects the second and third partial signals as the at least two partial signals when an amplitude of the input signal is greater than zero and is smaller than the amplitude of the first partial signal.

4. The LINC power amplifier according to claim 3, wherein the first circuit selects the first and second partial signals as the at least two partial signals when the amplitude of the input signal is greater than the amplitude of the first partial signal and is smaller than a sum of the amplitude of the first partial signal and the amplitude of the second partial signal.

5. The LING power amplifier according to claim 4, wherein the first circuit selects the first to third partial signals as the at least two partial signals when the amplitude of the input signal is greater than a sum of the amplitude of the first partial signal and the amplitude of the second partial signal and is smaller than a maximum amplitude of the input signal.

6. A LINC power amplifier, comprising:

at least three power amplifiers;

a first circuit coupled to the at least three power amplifiers and configured to determine at least one of a weight or phase of one of at least two partial signals of an input signal, based on an amplitude and a phase of the input signal, wherein the at least two partial signals have different amplitudes;

a second circuit configured to receive the at least two partial signals, the determined weights or phases associated with the at least two partial signals, and apply the received weights to the at least two partial signals such that an efficiency of the LINC power amplifier is increased; and a combiner configured to receive output signals from the second circuit and combine the output signal for transmission.

7. The LINC power amplifier of claim 6, wherein the weights of the at least two partial signals are determined based on a table in memory, and the table comprises one or more predetermined weights for the at least two partial signals.

8. The LINC power amplifier of claim 6, wherein the weights of the at least two partial signals are determined such that amplitudes of outphase components of the at least two partial signals are reduced.

9. The LINC power amplifier of claim 6, wherein the efficiency of the LINK power amplifier is increased based on the weights or phases of the at least two partial signals.

* * * * *